United States Patent

(12) United States Patent
Fujimori

(10) Patent No.: US 12,381,535 B2
(45) Date of Patent: Aug. 5, 2025

(54) ACOUSTIC WAVE DEVICE

(71) Applicant: Murata Manufacturing Co., Ltd., Nagaokakyo (JP)

(72) Inventor: Eiji Fujimori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 778 days.

(21) Appl. No.: 17/724,756

(22) Filed: Apr. 20, 2022

(65) Prior Publication Data
US 2022/0247380 A1    Aug. 4, 2022

Related U.S. Application Data

(63) Continuation of application No. PCT/JP2020/039551, filed on Oct. 21, 2020.

(30) Foreign Application Priority Data

Oct. 24, 2019    (JP) .................................. 2019-193231

(51) Int. Cl.
*H03H 9/25*    (2006.01)
*H03H 9/05*    (2006.01)
*H03H 9/64*    (2006.01)

(52) U.S. Cl.
CPC ............ *H03H 9/25* (2013.01); *H03H 9/0552* (2013.01); *H03H 9/059* (2013.01); *H03H 9/6473* (2013.01)

(58) Field of Classification Search
CPC ...... C12N 15/113; C12N 15/62; C12N 15/79; C12N 2510/02; C12N 5/0682;
(Continued)

(56) References Cited

U.S. PATENT DOCUMENTS

2003/0062969 A1* 4/2003 Inoue ..................... H03H 9/725
                                                            333/193
2004/0196119 A1   10/2004 Shibahara et al.
(Continued)

FOREIGN PATENT DOCUMENTS

JP    2004-282707 A    10/2004
JP    2011-130385 A    6/2011
(Continued)

OTHER PUBLICATIONS

Official Communication issued in International Patent Application No. PCT/JP2020/039551, mailed on Dec. 1, 2020.

*Primary Examiner* — Naishadh N Desai
(74) *Attorney, Agent, or Firm* — Keating & Bennett, LLP

(57) ABSTRACT

An acoustic wave device includes a piezoelectric substrate, first and second signal electrodes, and a first ground electrode on a first main surface of the piezoelectric substrate, at least one insulation layer on a second main surface of the piezoelectric substrate, first and second signal terminals provided indirectly on the second main surface with the insulation layer interposed therebetween, and a ground terminal on the second main surface. An acoustic wave filter is provided on the piezoelectric substrate. The first signal electrode and the first signal terminal are electrically coupled, the second signal electrode and the second signal terminal are electrically coupled, and the first ground electrode and the ground terminal are electrically coupled. The ground terminal includes a contact portion in contact with the second main surface of the piezoelectric substrate.

19 Claims, 6 Drawing Sheets

(58) Field of Classification Search
CPC ............. C12N 9/6413; H03H 9/02992; H03H 9/0552; H03H 9/058; H03H 9/059; H03H 9/25; H03H 9/6473; H03H 9/6476; H03H 9/6483
See application file for complete search history.

(56) References Cited

U.S. PATENT DOCUMENTS

| | | | |
|---|---|---|---|
| 2011/0146041 A1* | 6/2011 | Miyake | H03H 3/02 29/25.35 |
| 2017/0222625 A1* | 8/2017 | Nakamura | H03H 9/0547 |
| 2018/0013404 A1 | 1/2018 | Kawasaki et al. | |
| 2018/0269849 A1 | 9/2018 | Matsumoto et al. | |

FOREIGN PATENT DOCUMENTS

| | | |
|---|---|---|
| WO | 2016/067873 A1 | 5/2016 |
| WO | 2016/208287 A1 | 12/2016 |
| WO | 2017/110308 A1 | 6/2017 |

* cited by examiner

ACOUSTIC WAVE DEVICE

CROSS REFERENCE TO RELATED APPLICATIONS

This application claims the benefit of priority to Japanese Patent Application No. 2019-193231 filed on Oct. 24, 2019 and is a Continuation Applications of PCT Application No. PCT/JP2020/039551 filed on Oct. 21, 2020. The entire contents of each application are hereby incorporated herein by reference.

BACKGROUND OF THE INVENTION

1. Field of the Invention

The present invention relates to an acoustic wave device.

2. Description of the Related Art

Hitherto, acoustic wave devices have been widely used for filters in cellular phones. International Publication No. WO 2017/110308 discloses an exemplary acoustic wave device. In this acoustic wave device, an IDT (Interdigital Transducer) electrode is provided on one of two main surfaces of a piezoelectric substrate, which serves as an element substrate formed only of a piezoelectric layer. An insulation layer is provided on the other main surface of the element substrate, and a plurality of outer electrodes are provided on the insulation layer.

Examples of outer electrodes of an acoustic wave device include a signal outer electrode and a ground outer electrode. In the case where the acoustic wave device is a filter device, two or more signal outer electrodes, which are for output and input, are arranged. Here, because the piezoelectric substrate has a high dielectric constant, the parasitic capacitance of the piezoelectric substrate is large. Therefore, in the case where the outer electrodes of the acoustic wave device described in International Publication No. WO 2017/110308 are signal outer electrodes, coupling tends to occur between the signal outer electrodes with the parasitic capacitance of the piezoelectric substrate interposed therebetween. Accordingly, isolation characteristics may deteriorate. Such deterioration of isolation characteristics becomes particularly significant when the piezoelectric substrate is made smaller or thinner in order to reduce the size of the acoustic wave device.

SUMMARY OF THE INVENTION

Preferred embodiments of the present invention provide acoustic wave devices each capable of reducing or preventing deterioration of isolation characteristics.

An acoustic wave device according to a preferred embodiment of the present invention includes a first piezoelectric substrate including a first main surface and a second main surface that face each other, a first function electrode on the first main surface of the first piezoelectric substrate, a first signal electrode, a second signal electrode, and a first ground electrode on the first main surface of the first piezoelectric substrate, at least one insulation layer on the second main surface of the first piezoelectric substrate, a first signal terminal and a second signal terminal provided indirectly on the second main surface of the first piezoelectric substrate with the insulation layer interposed therebetween, and a ground terminal on the second main surface of the first piezoelectric substrate, wherein a first acoustic wave filter including the first function electrode, the first signal electrode, the second signal electrode, and the first ground electrode is provided on the first piezoelectric substrate, the first signal electrode and the first signal terminal are electrically coupled, the second signal electrode and the second signal terminal are electrically coupled, and the first ground electrode and the ground terminal are electrically coupled, and the ground terminal includes a contact portion that is in contact with the second main surface of the first piezoelectric substrate.

Acoustic wave devices each capable of reducing or preventing deterioration of isolation characteristics may be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

Note that each of the preferred embodiments described herein is exemplary, and configurations in different preferred embodiments may be partially replaced or combined.

Figure 1:
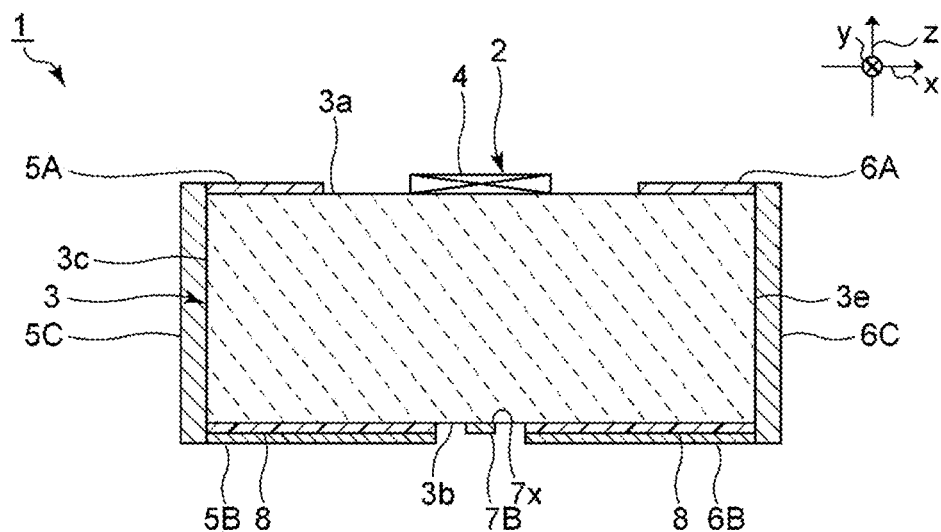
FIG. 1 is a schematic elevational cross-sectional view of an acoustic wave device according to a first preferred embodiment of the present invention.
Figure 2:
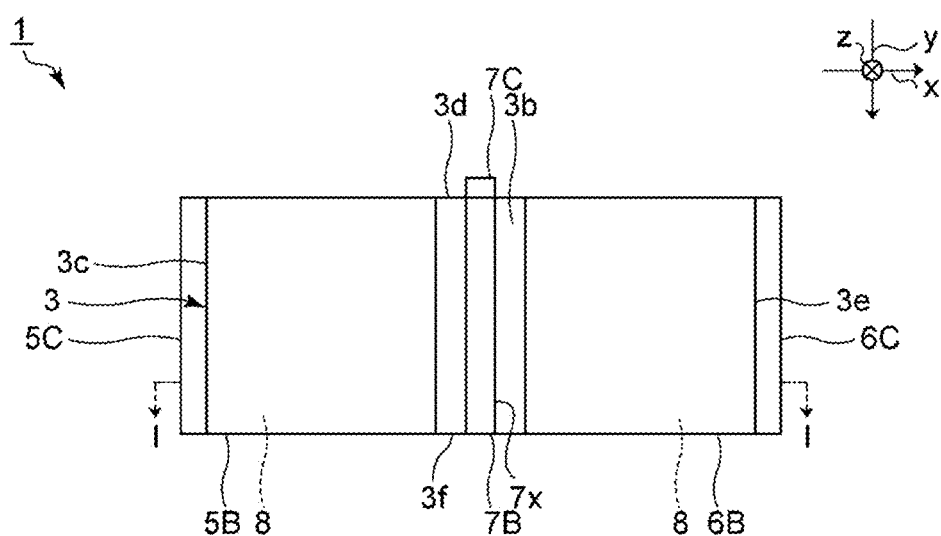
FIG. 2 is a schematic bottom view of the acoustic wave device according to the first preferred embodiment of the present invention.

FIG. 1 is a schematic elevational cross-sectional view of an acoustic wave device according to a first preferred embodiment of the present invention. FIG. 2 is a schematic bottom view of the acoustic wave device according to the first preferred embodiment. Note that FIG. 1 is a cross-sectional view taken along line I-I of FIG. 2. In FIG. 1, a later-described IDT electrode is indicated schematically by a rectangle with two diagonals. The same applies to drawings other than FIG. 1.

As illustrated in FIG. 1, an acoustic wave device 1 includes a piezoelectric substrate 3. The piezoelectric substrate 3 is rectangular and plate-shaped. The piezoelectric substrate 3 includes a first main surface 3a and a second main surface 3b, which face each other. As illustrated in FIG. 2, the piezoelectric substrate 3 includes a first lateral surface 3c, a second lateral surface 3d, a third lateral surface 3e, and a fourth lateral surface 3f. The first lateral surface 3c and the third lateral surface 3e face each other, and the second lateral surface 3d and the fourth lateral surface 3f face each other. The first lateral surface 3c, the second lateral surface 3d, the third lateral surface 3e, and the fourth lateral surface 3f are connected to the first main surface 3a and the second main surface 3b. In the present specification, plan view refers to the direction viewed from the top in FIG. 1. Bottom view refers to the direction viewed from the bottom in FIG. 1. It is assumed that the direction from the first lateral surface 3c to the third lateral surface 3e is the x direction, the direction from the second lateral surface 3d to the fourth lateral surface 3f is the y direction, and the direction from the second main surface 3b to the first main surface 3a is the z direction.

In the present preferred embodiment, the piezoelectric substrate 3 is a lithium niobate substrate. Note that the materials of the piezoelectric substrate 3 are not limited to the above, and, for example, lithium tantalate, zinc oxide, aluminum nitride, quartz, or PZT (lead zirconate titanate) may also be used.

As illustrated in FIG. 1, an acoustic wave filter 2 is provided on the piezoelectric substrate 3. More specifically, a plurality of IDT electrodes 4 are provided on the first main surface 3a of the piezoelectric substrate 3. In FIG. 1, one of the plurality of IDT electrodes 4 is illustrated. Note that the acoustic wave filter 2, the piezoelectric substrate 3, and the plurality of IDT electrodes 4 are a first acoustic wave filter, a first piezoelectric substrate, and a plurality of first function electrodes.

Furthermore, a first signal electrode 5A, a second signal electrode 6A, and a first ground electrode are provided on the first main surface 3a. The acoustic wave filter 2 includes the piezoelectric substrate 3, the IDT electrodes 4, the first signal electrode 5A, the second signal electrode 6A, and the first ground electrode. Note that it is preferable that at least one first ground electrode be provided.

Figure 3:
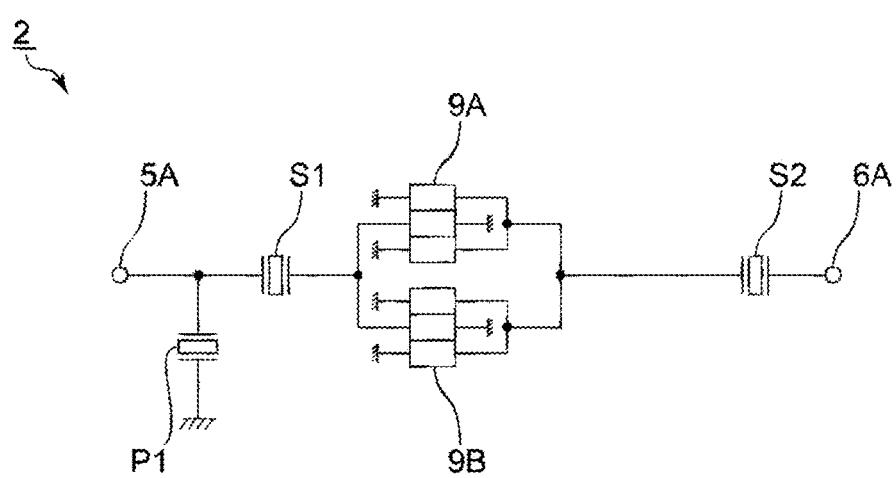
FIG. 3 is a circuit diagram of an acoustic wave filter according to the first preferred embodiment of the present invention.

FIG. 3 is a circuit diagram of the acoustic wave filter according to the first preferred embodiment.

The acoustic wave filter 2 includes a series arm resonator S1, a series arm resonator S2, a parallel arm resonator P1, a longitudinally-coupled resonator-type acoustic wave filter 9A, and a longitudinally-coupled resonator-type acoustic wave filter 9B. The series arm resonator S1 and the series arm resonator S2 are connected between the first signal electrode 5A and the second signal electrode 6A. The longitudinally-coupled resonator-type acoustic wave filter 9A and the longitudinally-coupled resonator-type acoustic wave filter 9B are connected in parallel between the series arm resonator S1 and the series arm resonator S2. The parallel arm resonator P1 is connected between the first signal electrode 5A and a ground potential. Note that the IDT electrode 4 of the parallel arm resonator P1 is connected to a ground electrode, and the parallel arm resonator P1 is connected to a ground potential with the ground electrode interposed therebetween.

The series arm resonator S1, the series arm resonator S2, and the parallel arm resonator P1 are each an acoustic wave resonator. More specifically, the series arm resonator S1, the series arm resonator S2, and the parallel arm resonator P1 are each a surface acoustic wave resonator, and each include the IDT electrode 4. The longitudinally-coupled resonator-type acoustic wave filter 9A and the longitudinally-coupled resonator-type acoustic wave filter 9B each include the plurality of IDT electrodes 4. Although the IDT electrodes 4 are indicated by the same reference numeral in the present specification, the design parameters of the IDT electrodes 4 may differ according to desired characteristics. The same applies to other IDT electrodes described later.

In the present preferred embodiment, a signal is input from the first signal electrode 5A to the acoustic wave filter 2, and a signal is output from the second signal electrode 6A. Note that the circuit configuration of the acoustic wave filter 2 is not limited to the above. For example, the circuit configuration may be such that a signal is input from the second signal electrode 6A, and a signal is output from the first signal electrode 5A. Alternatively, it is preferable that the acoustic wave filter 2 include at least one function electrode.

As illustrated in FIGS. 1 and 2, a plurality of insulation layers 8 are provided on the second main surface 3b of the piezoelectric substrate 3. In the present preferred embodiment, the insulation layers 8 are polyimide layers. Note that the materials of the insulation layers are not limited to the above, and, for example, a resin such as an epoxy resin, or an inorganic insulator such as silicon oxide or silicon nitride may also be used. In the present preferred embodiment, the relative dielectric constant of the piezoelectric substrate 3 is less than the relative dielectric constant of the insulation layers 8.

A first signal terminal 5B and a second signal terminal 6B are provided on the respective insulation layers 8. A first connection electrode 5C is provided on the first lateral surface 3c. A second connection electrode 6C is provided on the third lateral surface 3e. The first connection electrode 5C is connected to the first signal terminal 5B and the first signal electrode 5A. The second connection electrode 6C is connected to the second signal terminal 6B and the second signal electrode 6A.

Furthermore, a ground terminal 7B is provided directly on the second main surface 3b of the piezoelectric substrate 3. Therefore, the ground terminal 7B includes a contact portion 7x, which is in contact with the piezoelectric substrate 3. Note that it is preferable that at least a portion of the ground terminal 7B be in contact with the second main surface 3b of the piezoelectric substrate 3. For example, a portion of the ground terminal 7B may be provided indirectly on the second main surface 3b with the insulation layer 8 interposed therebetween. Although the plurality of insulation layers 8 are provided in the present preferred embodiment, it is preferable that at least one insulation layer 8 be provided. It is also preferable that the first signal terminal 5B and the second signal terminal 6B be provided on the insulation layers 8, and that the ground terminal 7B have the contact portion 7x.

In the present preferred embodiment, the contact portion 7x of the ground terminal 7B is positioned between the first signal terminal 5B and the second signal terminal 6B in plan view. Note that the contact portion 7x need not be positioned between the first signal terminal 5B and the second signal terminal 6B.

As illustrated in FIG. 2, a first ground connection electrode 7C is provided on the second lateral surface 3d of the piezoelectric substrate 3. The first ground connection electrode 7C is connected to the first ground electrode and the ground terminal 7B. The first ground electrode is connected to a ground potential with the first ground connection electrode 7C and the ground terminal 7B interposed therebetween.

In the acoustic wave device 1, a bump may be provided on each of the first signal terminal 5B, the second signal terminal 6B, and the ground terminal 7B. In the case where the acoustic wave device 1 includes a plurality of bumps, the acoustic wave device 1 is electrically coupled to the outside by the plurality of bumps. However, the acoustic wave device 1 need not include bumps.

In the present preferred embodiment, a signal is input from the first signal terminal 5B to the acoustic wave device 1, and a signal is output from the second signal terminal 6B. Note that the configuration may be such that, depending on the circuit configuration of the acoustic wave filter 2, a signal is input from the second signal terminal 6B, and a signal is output from the first signal terminal 5B.

A unique feature of the present preferred embodiment is that the first signal terminal 5B and the second signal terminal 6B are provided indirectly on the second main surface 3b of the piezoelectric substrate 3 with the insulation layers 8 interposed therebetween, and that the ground terminal 7B includes the contact portion 7x. Accordingly, deterioration of isolation characteristics is able to be reduced or prevented. This will be described hereinafter by comparing the present preferred embodiment and a comparative example.

The comparative example is different from the first preferred embodiment in the point that a ground terminal is provided on an insulation layer, and that the ground terminal has no contact portion. In the first preferred embodiment and the comparative example, the relative dielectric constant of the insulation layers is less than the relative dielectric constant of the piezoelectric substrate.

Figure 4:
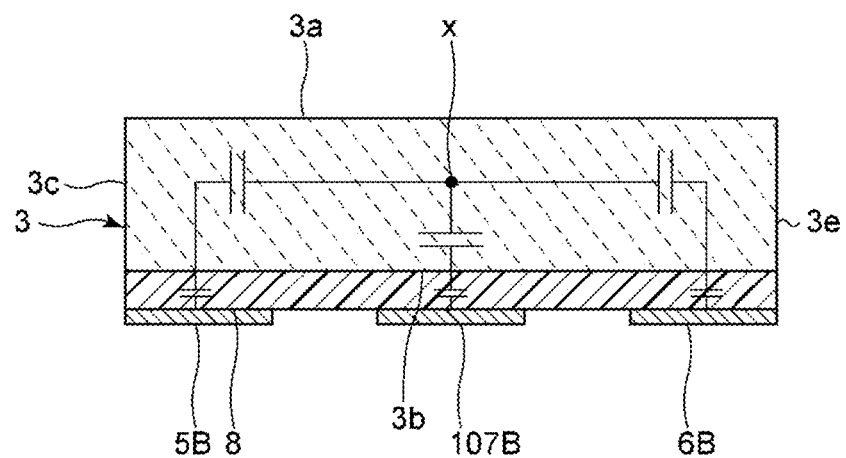
FIG. 4 is a schematic diagram illustrating electrical coupling in a comparative example.
Figure 5:
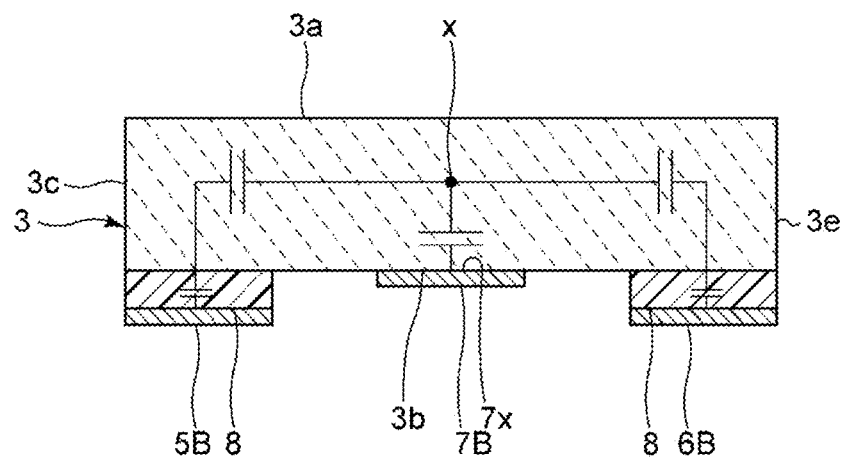
FIG. 5 is a schematic diagram illustrating electrical coupling in the first preferred embodiment of the present invention.

FIG. 4 is a schematic diagram illustrating electrical coupling in the comparative example. FIG. 5 is a schematic diagram illustrating electrical coupling in the first preferred embodiment.

As illustrated in FIG. 4, the insulation layers 8 and the piezoelectric substrate 3 function as capacitive elements. Thus, it may be said that the insulation layers 8 and the piezoelectric substrate 3 defining and functioning as capacitive elements are connected between the first signal terminal 5B and the second signal terminal 6B. Therefore, a signal input from the first signal terminal 5B is propagated to the second signal terminal 6B by way of the insulation layers 8 and the piezoelectric substrate 3. In this case, isolation characteristics are deteriorated.

Here, a ground terminal 107B is positioned between the first signal terminal 5B and the second signal terminal 6B. If a signal input from the first signal terminal 5B is propagated to the ground terminal 107B side, the signal may be prevented from propagating to the second signal terminal 6B. However, the insulation layers 8 in addition to the piezoelectric substrate 3 are provided between a node X between the first signal terminal 5B and the second signal terminal 6B and the ground terminal 107B. Thus, in the comparative example, capacitive elements including the insulation layers 8 are connected in series to the capacitive element including the piezoelectric substrate 3. Therefore, the capacitance between the node x and the ground terminal 107B becomes smaller. Furthermore, since the relative dielectric constant of the insulation layers 8 is small as described above, the capacitance between the node x and the ground terminal 107B becomes significantly smaller. Therefore, it becomes difficult to sufficiently propagate a signal that has propagated from the first signal terminal 5B to the piezoelectric substrate 3 to the ground terminal 107B side. Thus, it becomes difficult to sufficiently reduce or prevent propagation of a signal from the first signal terminal 5B to the second signal terminal 6B.

In contrast, as illustrated in FIG. 5, in the first preferred embodiment, the ground terminal 7B includes the contact portion 7x, which is in contact with the piezoelectric substrate 3. Capacitive elements including the insulation layers 8 are not connected between the ground terminal 7B and the piezoelectric substrate 3. Therefore, the capacitance between the node x and the ground terminal 7B is greater than the comparative example. Thus, a signal that has propagated from the first signal terminal 5B to the piezoelectric substrate 3 may be sufficiently propagated to the ground terminal 7B side, and the signal may be prevented from propagating to the second signal terminal 6B.

Figure 6:
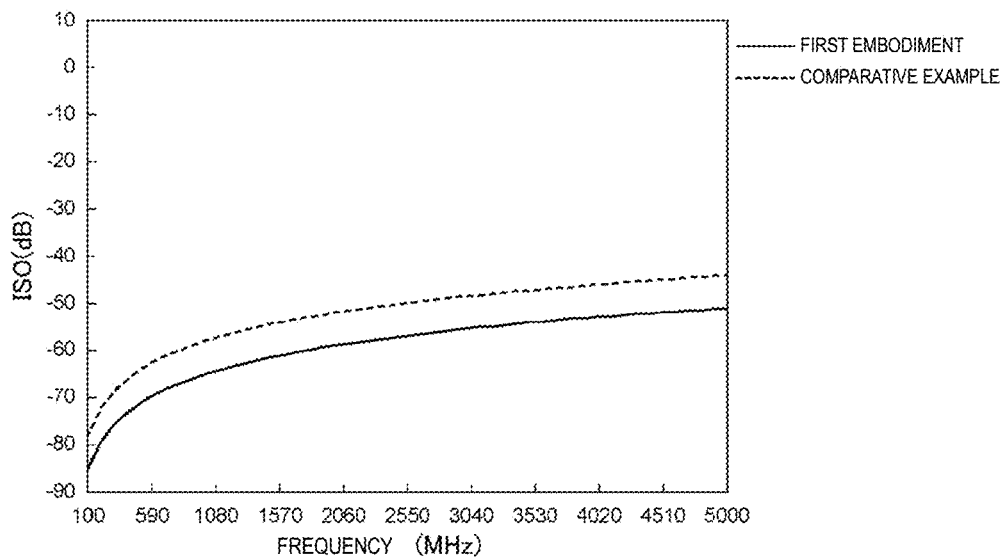
FIG. 6 is a diagram illustrating characteristics of isolation between a first signal terminal and a second signal terminal in the first preferred embodiment of the present invention and in the comparative example.

FIG. 6 is a diagram illustrating isolation characteristics between the first signal terminal and the second signal terminal in the first preferred embodiment and the comparative example. In FIG. 6, the lower the value of ISO on the ordinate, the better the isolation characteristics.

As illustrated in FIG. 6, it is clear that the value of ISO is lower in the first preferred embodiment than in the comparative example. Thus, deterioration of isolation characteristics may be reduced or prevented in the first preferred embodiment.

As illustrated in FIG. 2, it is preferable that the contact portion 7x of the ground terminal 7B be positioned between the first signal terminal 5B and the second signal terminal 6B in plan view. Accordingly, before a signal that has propagated from the first signal terminal 5B to the piezoelectric substrate 3 reaches the second signal terminal 6B, the signal may be further propagated to the ground terminal 7B side. Therefore, deterioration of isolation characteristics may be further reduced or prevented.

The first signal terminal 5B and the second signal terminal 6B may be partially in contact with the piezoelectric substrate 3. It is preferable that the first signal terminal 5B and the second signal terminal 6B be entirely provided indirectly on the second main surface 3b of the piezoelectric substrate 3 with the insulation layers 8 interposed therebetween. Accordingly, isolation characteristics may be improved.

Figure 7:
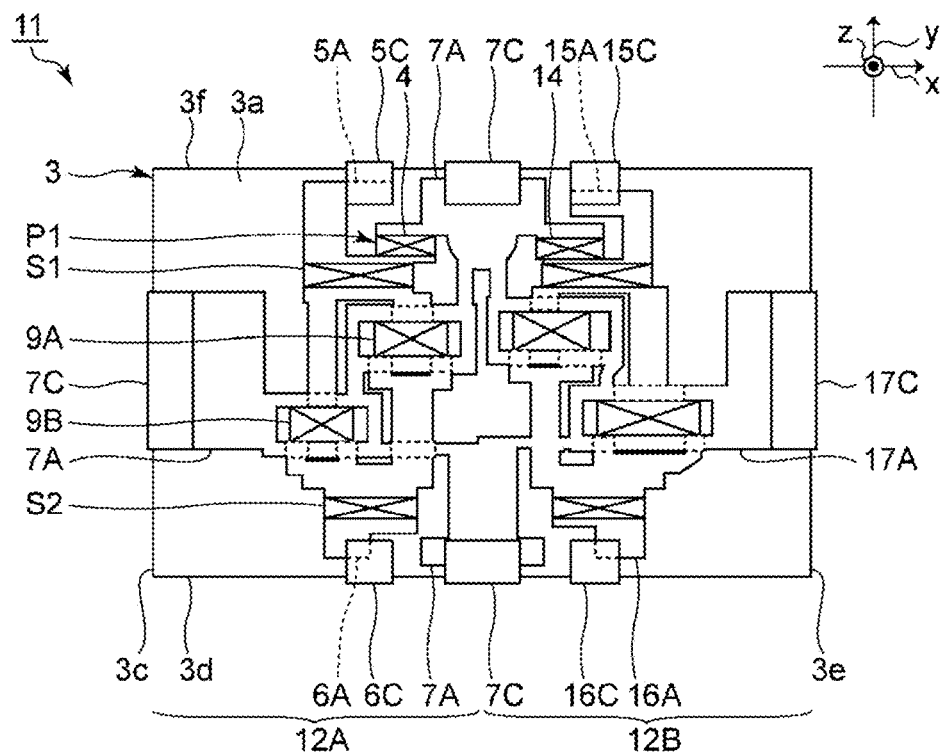
FIG. 7 is a schematic plan view of an acoustic wave device according to a second preferred embodiment of the present invention.

FIG. 7 is a schematic plan view of an acoustic wave device according to a second preferred embodiment.

An acoustic wave device 11 of the present preferred embodiment is a duplexer. The acoustic wave device 11 includes a first acoustic wave filter 12A and a second acoustic wave filter 12B. The first acoustic wave filter 12A has the same configuration as the acoustic wave filter 2 of the first preferred embodiment. In the present preferred embodiment, the first acoustic wave filter 12A and the second acoustic wave filter 12B are provided on the same piezoelectric substrate 3.

More specifically, the first acoustic wave filter 12A includes the piezoelectric substrate 3, the first signal electrode 5A, the second signal electrode 6A, and a plurality of first ground electrodes 7A. The first acoustic wave filter 12A further includes the plurality of IDT electrodes 4, which define and function as a plurality of first IDT electrodes. The circuit configuration of the first acoustic wave filter 12A is the same as the acoustic wave filter 2 of the first preferred embodiment.

The second acoustic wave filter 12B includes the piezoelectric substrate 3, a plurality of second IDT electrodes 14, a third signal electrode 15A, a fourth signal electrode 16A, and a second ground electrode 17A. Note that the second acoustic wave filter 12B shares the piezoelectric substrate 3 with the first acoustic wave filter 12A, as mentioned above. The plurality of second IDT electrodes 14, the third signal electrode 15A, the fourth signal electrode 16A, and the second ground electrode 17A are provided on the first main surface 3a of the piezoelectric substrate 3. The second IDT electrodes 14 are second function electrodes. It is preferable that at least one second IDT electrode 14 and at least one second ground electrode 17A be provided. The circuit configuration of the second acoustic wave filter 12B is not particularly limited. Note that, in the present preferred embodiment, the circuit configuration of the second acoustic wave filter 12B is the same as the first acoustic wave filter 12A.

In the present preferred embodiment, one or some of the first ground electrodes 7A are shared by the first acoustic wave filter 12A and the second acoustic wave filter 12B. More specifically, for example, the first IDT electrode and the second IDT electrode 14 of respective parallel arm resonators in the first acoustic wave filter 12A and the second acoustic wave filter 12B are connected to the same first ground electrode 7A. Alternatively, the first IDT electrodes and the second IDT electrodes 14 of respective longitudinally-coupled resonator-type acoustic wave filters in the first acoustic wave filter 12A and the second acoustic wave filter 12B are connected to the same first ground electrode 7A.

By the way, it is assumed in the present preferred embodiment that a ground electrode shared by the first acoustic wave filter 12A and the second acoustic wave filter 12B is a ground electrode included in the plurality of first ground electrodes 7A. However, a ground electrode shared by the first acoustic wave filter 12A and the second acoustic wave filter 12B may be the first ground electrode 7A or the second ground electrode 17A. The same applies to the case in which a ground electrode is shared by a plurality of acoustic wave filters in preferred embodiments other than the present preferred embodiment. Alternatively, a plurality of acoustic wave filters need not share the same ground electrode.

Figure 8:
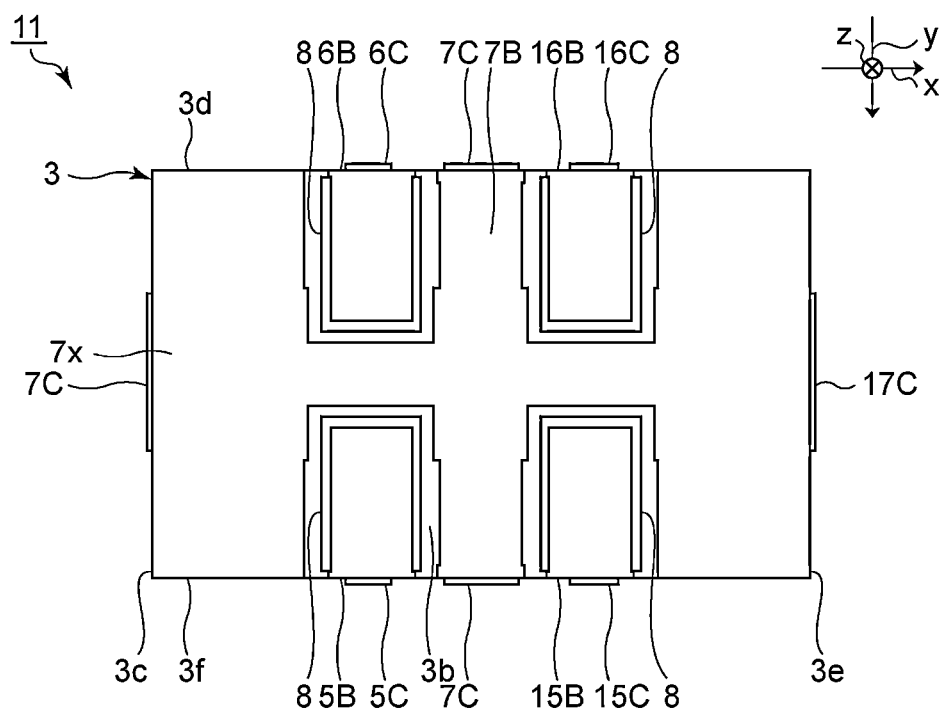
FIG. 8 is a schematic bottom view of the acoustic wave device according to the second preferred embodiment of the present invention.

FIG. 8 is a schematic bottom view of the acoustic wave device according to the second preferred embodiment.

The plurality of insulation layers 8 are provided on the second main surface 3b of the piezoelectric substrate 3. The first signal terminal 5B is provided on the insulation layer 8. The first connection electrode 5C is provided on the fourth lateral surface 3f of the piezoelectric substrate 3. As illustrated in FIG. 7, the first connection electrode 5C extends on the first main surface 3a of the piezoelectric substrate 3 and on the first signal electrode 5A. The first connection electrode 5C is connected to the first signal terminal 5B and the first signal electrode 5A.

Similarly, as illustrated in FIG. 8, the second signal terminal 6B, a third signal terminal 15B, and a fourth signal terminal 16B are each provided on the second main surface 3b of the piezoelectric substrate 3 with the insulation layer 8 interposed therebetween. A third connection electrode 15C is provided on the fourth lateral surface 3f of the piezoelectric substrate 3. The second connection electrode 6C and a fourth connection electrode 16C are provided on the second lateral surface 3d. As illustrated in FIGS. 7 and 8, the second connection electrode 6C is connected to the second signal terminal 6B and the second signal electrode 6A. The third connection electrode 15C is connected to the third signal electrode 15A and the third signal terminal 15B. The fourth connection electrode 16C is connected to the fourth signal electrode 16A and the fourth signal terminal 16B.

As illustrated in FIG. 8, the ground terminal 7B is provided directly on the second main surface 3b of the piezoelectric substrate 3. The ground terminal 7B includes the contact portion 7x, which is in contact with the piezoelectric substrate 3. In the acoustic wave device 11, like the first preferred embodiment, the entire ground terminal 7B is the contact portion 7x. However, it is preferable that at least a portion of the ground terminal 7B be in contact with the second main surface 3b of the piezoelectric substrate 3.

In the present preferred embodiment, a plurality of first ground connection electrodes 7C are provided. More specifically, the first ground connection electrodes 7C are provided respectively on the first lateral surface 3c, the second lateral surface 3d, and the fourth lateral surface 3f of the piezoelectric substrate 3. Furthermore, a second ground connection electrode 17C is provided on the third lateral surface 3e. The first ground connection electrodes 7C, the second ground connection electrode 17C, the first connection electrode 5C, the second connection electrode 6C, the third connection electrode 15C, and the fourth connection electrode 16C are provided so as not to be in contact with each other. As illustrated in FIGS. 7 and 8, the first ground connection electrodes 7C are connected to the first ground electrodes 7A and the ground terminal 7B. The second ground connection electrode 17C is connected to the second ground electrode 17A and the ground terminal 7B.

As described above, in the present preferred embodiment, one ground terminal 7B is shared by the first acoustic wave filter 12A and the second acoustic wave filter 12B. However, the first acoustic wave filter 12A and the second acoustic wave filter 12B need not share one ground terminal 7B. The acoustic wave device 11 may include a ground terminal to which the first acoustic wave filter 12A is connected, and a ground terminal to which the second acoustic wave filter 12B is connected.

In the acoustic wave device 11, signals are input from the first signal terminal 5B and the third signal terminal 15B, and signals are output from the second signal terminal 6B and the fourth signal terminal 16B. However, the input and output directions are not limited to the above.

Also, in the present preferred embodiment, the first signal terminal 5B, the second signal terminal 6B, the third signal terminal 15B, and the fourth signal terminal 16B in each acoustic wave filter are provided indirectly on the second main surface 3b of the piezoelectric substrate 3 with the insulation layers 8 interposed therebetween. In addition, the ground terminal 7B includes the contact portion 7x. Accordingly, like the first preferred embodiment, a signal that has propagated from the first signal terminal 5B to the piezoelectric substrate 3 may be sufficiently propagated to the ground terminal 7B side. Furthermore, a signal that has propagated from the third signal terminal 15B to the piezoelectric substrate 3 may also be sufficiently propagated to the ground terminal 7B side. Thus, these signals may be prevented from propagating to each of the other signal terminals. Therefore, deterioration of isolation characteristics may be reduced or prevented.

As illustrated in FIG. 8, it is preferable that the contact portion 7x of the ground terminal 7B be positioned between the first signal terminal 5B and the third signal terminal 15B in plan view. Accordingly, before a signal that has propagated from the first signal terminal 5B to the piezoelectric substrate 3 reaches the third signal terminal 15B, the signal may be further propagated to the ground terminal 7B side. Furthermore, before a signal that has propagated from the third signal terminal 15B to the piezoelectric substrate 3 reaches the first signal terminal 5B, the signal may be further propagated to the ground terminal 7B side. Therefore, deterioration of isolation characteristics between the first acoustic wave filter 12A and the second acoustic wave filter 12B may be further and more effectively reduced or prevented.

Figure 9:
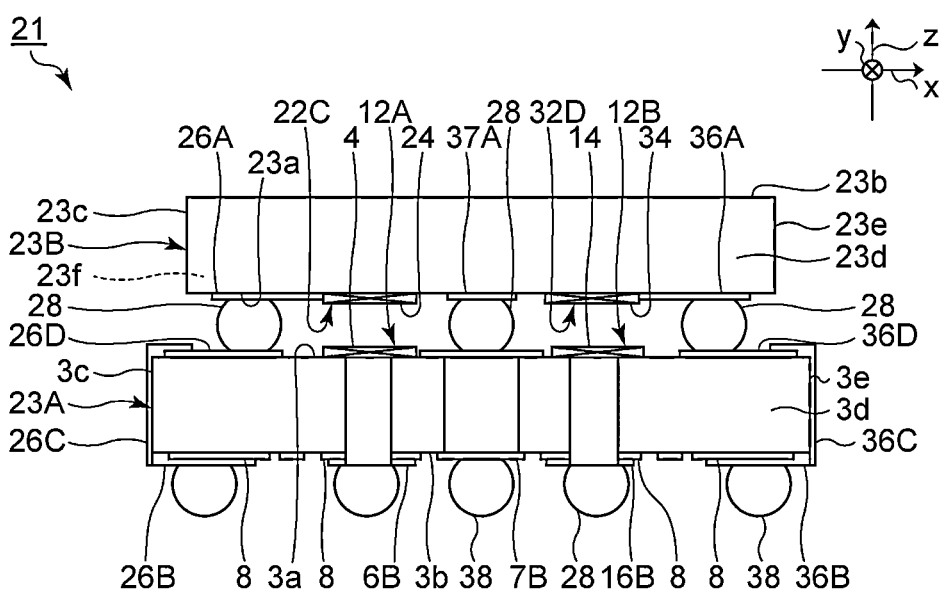
FIG. 9 is a schematic elevational view of an acoustic wave device according to a third preferred embodiment of the present invention.

FIG. 9 is a schematic elevational view of an acoustic wave device according to a third preferred embodiment.

An acoustic wave device 21 of the present preferred embodiment is a multiplexer. The acoustic wave device 21 includes the first acoustic wave filter 12A, the second acoustic wave filter 12B, a third acoustic wave filter 22C, and a fourth acoustic wave filter 32D. Portions of the acoustic wave device 21 that are related to the first acoustic wave filter 12A and the second acoustic wave filter 12B are configured in the same manner as the second preferred embodiment.

The acoustic wave device 21 includes a first piezoelectric substrate 23A and a second piezoelectric substrate 23B. The first piezoelectric substrate 23A is configured in the same manner as the piezoelectric substrate 3 of the second preferred embodiment. Portions of the first piezoelectric substrate 23A are indicated by using the reference numerals of portions of the piezoelectric substrate 3 of the second preferred embodiment. The second piezoelectric substrate 23B is also rectangular and plate-shaped, like the first piezoelectric substrate 23A. The second piezoelectric substrate 23B includes a third main surface 23a and a fourth main surface 23b, which face each other.

The second piezoelectric substrate 23B includes a fifth lateral surface 23c, a sixth lateral surface 23d, a seventh lateral surface 23e, and an eighth lateral surface 23f. The fifth lateral surface 23c, the sixth lateral surface 23d, the seventh lateral surface 23e, and the eighth lateral surface 23f are connected to the third main surface 23a and the fourth main surface 23b.

The first acoustic wave filter 12A and the second acoustic wave filter 12B are configured on the first piezoelectric substrate 23A. The third acoustic wave filter 22C and the fourth acoustic wave filter 32D are configured on the second piezoelectric substrate 23B. In the present preferred embodiment, each acoustic wave filter configured on the first piezoelectric substrate 23A and each acoustic wave filter configured on the second piezoelectric substrate 23B are stacked. More specifically, the acoustic wave device 21 includes a plurality of bumps 28. The first piezoelectric substrate 23A and the second piezoelectric substrate 23B are joined by the plurality of bumps 28 so that the first main surface 3a of the first piezoelectric substrate 23A and the third main surface 23a of the second piezoelectric substrate 23B will face each other across a gap.

In plan view, the first acoustic wave filter 12A and the third acoustic wave filter 22C at least partially overlap each other. Similarly, in plan view, the second acoustic wave filter 12B and the fourth acoustic wave filter 32D at least partially overlap each other. Accordingly, the acoustic wave device 21 may be made smaller. However, the positional relationship among the first acoustic wave filter 12A, the second acoustic wave filter 12B, the third acoustic wave filter 22C, and the fourth acoustic wave filter 32D in plan view is not limited to the above. Alternatively, the first acoustic wave filter 12A, the second acoustic wave filter 12B, the third acoustic wave filter 22C, and the fourth acoustic wave filter 32D may be provided on the same piezoelectric substrate.

Although the number of acoustic wave filters in the acoustic wave device 21 is four in the present preferred embodiment, this is not the only possible number. It is preferable that the acoustic wave device 21, which is a multiplexer, include three or more acoustic wave filters.

Hereinafter, the specific configuration of the third acoustic wave filter 22C and the fourth acoustic wave filter 32D will be described.

Figure 10:
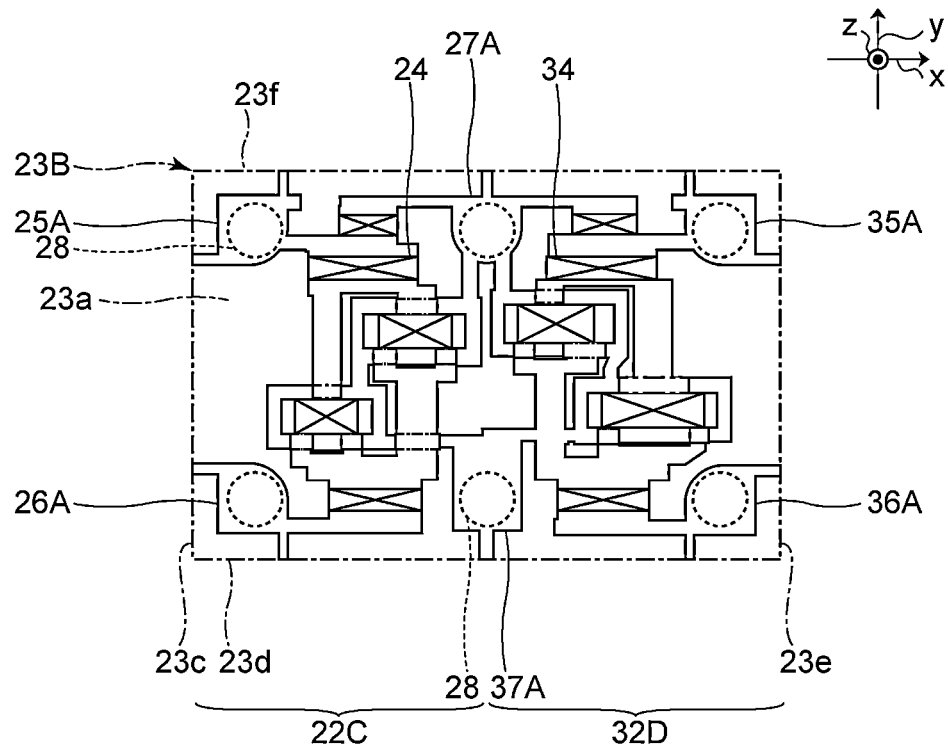
FIG. 10 is a schematic plan view of a third acoustic wave filter and a fourth acoustic wave filter according to the third preferred embodiment of the present invention in the case where a second piezoelectric substrate is seen through and viewed in plan.

FIG. 10 is a schematic plan view of the third acoustic wave filter and the fourth acoustic wave filter according to the third preferred embodiment in the case where the second piezoelectric substrate is seen through and viewed in plan.

As illustrated in FIG. 10, the third acoustic wave filter 22C includes the second piezoelectric substrate 23B, a plurality of third IDT electrodes 24, a fifth signal electrode 25A, a sixth signal electrode 26A, and a third ground electrode 27A. The plurality of third IDT electrodes 24, the fifth signal electrode 25A, the sixth signal electrode 26A, and the third ground electrode 27A are provided on the third main surface 23a of the second piezoelectric substrate 23B. The third IDT electrodes 24 are third function electrodes. It is preferable that at least one third IDT electrode 24 and at least one third ground electrode 27A be provided.

The fourth acoustic wave filter 32D includes the second piezoelectric substrate 23B, a plurality of fourth IDT electrodes 34, a seventh signal electrode 35A, an eighth signal electrode 36A, and a fourth ground electrode 37A. The plurality of fourth IDT electrodes 34, the seventh signal electrode 35A, the eighth signal electrode 36A, and the fourth ground electrode 37A are provided on the third main surface 23a of the second piezoelectric substrate 23B. It is preferable that at least one fourth IDT electrode 34 be provided. The third acoustic wave filter 22C and the fourth acoustic wave filter 32D share the second piezoelectric substrate 23B. Furthermore, the third acoustic wave filter 22C and the fourth acoustic wave filter 32D share the third ground electrode 27A and the fourth ground electrode 37A.

In the present preferred embodiment, the circuit configuration of the third acoustic wave filter 22C and the fourth acoustic wave filter 32D is the same as the first acoustic wave filter 12A. However, the circuit configuration of the third acoustic wave filter 22C and the fourth acoustic wave filter 32D is not limited to the above.

As illustrated in FIG. 10, the bumps 28 are provided respectively on the fifth signal electrode 25A, the sixth signal electrode 26A, the seventh signal electrode 35A, the eighth signal electrode 36A, the third ground electrode 27A, and the fourth ground electrode 37A. As illustrated in FIG. 9, these bumps 28 join the first piezoelectric substrate 23A and the second piezoelectric substrate 23B.

In the present preferred embodiment, signal terminals to electrically couple the third acoustic wave filter 22C and the fourth acoustic wave filter 32D to the outside are provided on the second main surface 3b of the first piezoelectric substrate 23A. Hereinafter, the details of the connection between the signal terminals and the above-mentioned signal electrodes will be specifically described.

Figure 11:
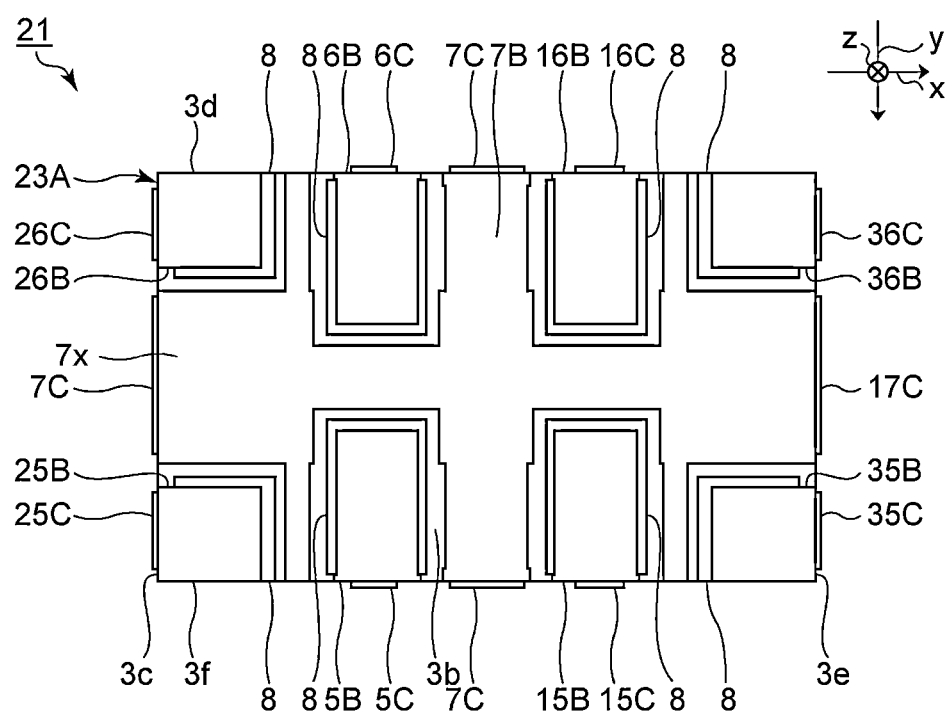
FIG. 11 is a schematic bottom view of the acoustic wave device according to the third preferred embodiment of the present invention.
Figure 12:
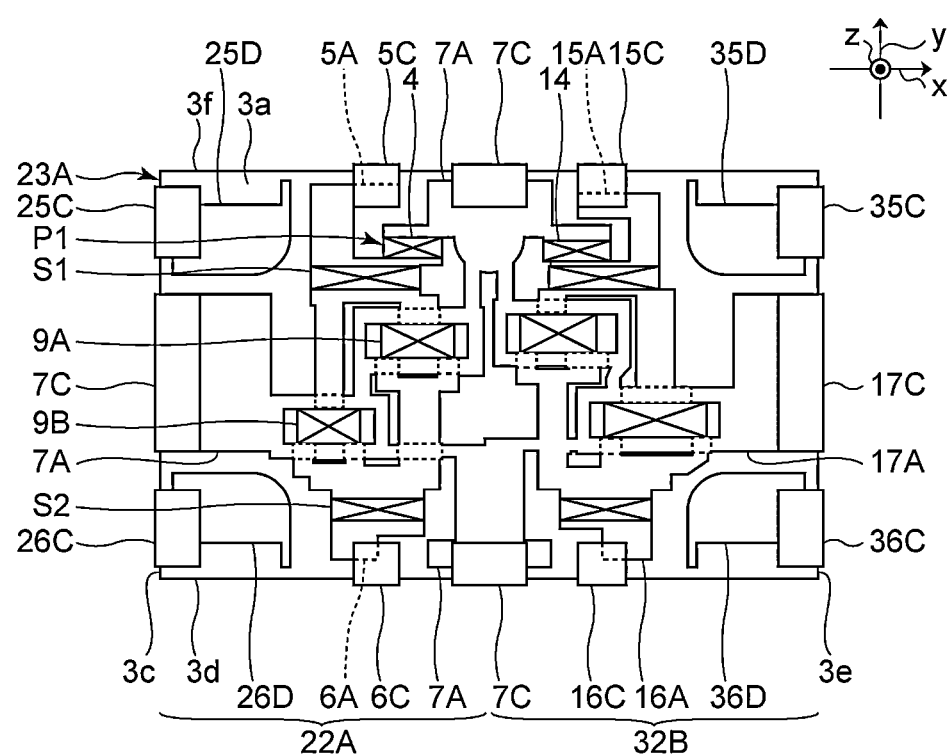
FIG. 12 is a schematic plan view illustrating the electrode configuration on a first piezoelectric substrate according to the third preferred embodiment of the present invention.

FIG. 11 is a schematic bottom view of the acoustic wave device according to the third preferred embodiment. FIG. 12 is a schematic plan view illustrating the electrode configuration on the first piezoelectric substrate according to the third preferred embodiment.

As illustrated in FIG. 11, in the present preferred embodiment, the plurality of insulation layers 8 are provided near the corner portions of the second main surface 3b of the first piezoelectric substrate 23A. A fifth signal terminal 25B, a sixth signal terminal 26B, a seventh signal terminal 35B, and an eighth signal terminal 36B are provided respectively on the insulation layers 8. In addition, like the second preferred embodiment, the first signal terminal 5B, the second signal terminal 6B, the third signal terminal 15B, and the fourth signal terminal 16B are provided on the second main surface 3b with the other insulation layers 8 interposed therebetween. However, the positional relationship among the signal terminals is not limited to the above.

A fifth connection electrode 25C and a sixth connection electrode 26C are provided on the first lateral surface 3c of the first piezoelectric substrate 23A. A seventh connection electrode 35C and an eighth connection electrode 36C are provided on the third lateral surface 3e. Note that, in the present preferred embodiment, the first ground connection electrode 7C is positioned between the fifth connection electrode 25C and the sixth connection electrode 26C. The second ground connection electrode 17C is positioned between the seventh connection electrode 35C and the eighth connection electrode 36C.

In contrast, as illustrated in FIG. 12, in the present preferred embodiment, a first pad electrode 25D, a second pad electrode 26D, a third pad electrode 35D, and a fourth pad electrode 36D are provided near the corner portions of the first main surface 3a of the first piezoelectric substrate 23A. The fifth connection electrode 25C is connected to the first pad electrode 25D and the fifth signal terminal 25B. The sixth connection electrode 26C is connected to the second pad electrode 26D and the sixth signal terminal 26B. The seventh connection electrode 35C is connected to the third pad electrode 35D and the seventh signal terminal 35B. The eighth connection electrode 36C is connected to the fourth pad electrode 36D and the eighth signal terminal 36B.

As illustrated in FIG. 9, the second pad electrode 26D and the sixth signal electrode 26A are joined by the bump 28. The fourth pad electrode 36D and the eighth signal electrode 36A are joined by the bump 28. Similarly, the first pad electrode 25D and the fifth signal electrode 25A are joined by the bump 28, and the third pad electrode 35D and the seventh signal electrode 35A are joined by the bump 28. Furthermore, the third ground electrode 27A and the fourth ground electrode 37A are also joined by the bumps 28 with the first ground electrode 7A. Accordingly, the first piezoelectric substrate 23A and the second piezoelectric substrate 23B are joined together.

As described above, the fifth signal electrode 25A is electrically coupled to the fifth signal terminal 25B with the bump 28, the first pad electrode 25D, and the fifth connection electrode 25C interposed therebetween. The sixth signal electrode 26A is electrically coupled to the sixth signal terminal 26B with the bump 28, the second pad electrode 26D, and the sixth connection electrode 26C interposed therebetween. The seventh signal electrode 35A is electrically coupled to the seventh signal terminal 35B with the bump 28, the third pad electrode 35D, and the seventh connection electrode 35C interposed therebetween. The eighth signal electrode 36A is electrically coupled to the eighth signal terminal 36B with the bump 28, the fourth pad electrode 36D, and the eighth connection electrode 36C interposed therebetween. Furthermore, the third ground electrode 27A and the fourth ground electrode 37A are each electrically coupled to the ground terminal 7B with the bump 28, the first ground electrode 7A, and the first ground connection electrode 7C interposed therebetween.

In the present preferred embodiment, all the acoustic wave filters share the ground terminal 7B. However, the first acoustic wave filter 12A, the second acoustic wave filter 12B, the third acoustic wave filter 22C, and the fourth acoustic wave filter 32D need not share one ground terminal 7B.

As illustrated in FIG. 9, bumps 38 are provided respectively on the second signal terminal 6B, the fourth signal terminal 16B, the sixth signal terminal 26B, the eighth signal terminal 36B, and the ground terminal 7B. Similarly, the bumps 38 are also provided respectively on the first signal terminal 5B, the third signal terminal 15B, the fifth signal terminal 25B, and the seventh signal terminal 35B. The acoustic wave device 21 is mounted on an outer mounting substrate by these bumps 38 and is electrically coupled to the outside.

In the acoustic wave device 21, signals are input from the first signal terminal 5B, the third signal terminal 15B, the fifth signal terminal 25B, and the seventh signal terminal 35B. In contrast, signals are output from the second signal terminal 6B, the fourth signal terminal 16B, the sixth signal terminal 26B, and the eighth signal terminal 36B. However, the input and output directions are not limited to the above.

As illustrated in FIG. 11, also in the present preferred embodiment, the first signal terminal 5B, the second signal terminal 6B, the third signal terminal 15B, and the fourth signal terminal 16B in each acoustic wave filter are provided indirectly on the second main surface 3b of the first piezoelectric substrate 23A with the insulation layers 8 interposed therebetween. Furthermore, the fifth signal terminal 25B, the sixth signal terminal 26B, the seventh signal terminal 35B, and the eighth signal terminal 36B in each of the other acoustic wave filters are provided indirectly on the second main surface 3b of the first piezoelectric substrate 23A with the insulation layers 8 interposed therebetween. In addition, the ground terminal 7B includes the contact portion 7x. Accordingly, like the second preferred embodiment, a signal that has propagated from the first signal terminal 5B to the first piezoelectric substrate 23A and a signal that has propagated from the third signal terminal 15B to the first piezoelectric substrate 23A may be sufficiently propagated to the ground terminal 7B side. Furthermore, a signal that has propagated from the fifth signal terminal 25B to the first piezoelectric substrate 23A and a signal that has propagated from the seventh signal terminal 35B to the first piezoelectric substrate 23A may also be sufficiently propagated to the ground terminal 7B side. Thus, these signals may be prevented from propagating to each of the other signal terminals. Therefore, deterioration of isolation characteristics may be reduced or prevented.

It is preferable that the contact portion 7x of the ground terminal 7B be positioned between the first signal terminal 5B and the fifth signal terminal 25B in plan view. Accordingly, before a signal that has propagated from the first signal terminal 5B to the first piezoelectric substrate 23A reaches the fifth signal terminal 25B, the signal may be further propagated to the ground terminal 7B side. Furthermore, before a signal that has propagated from the fifth signal terminal 25B to the first piezoelectric substrate 23A reaches the first signal terminal 5B, the signal may be further propagated to the ground terminal 7B side. Therefore, deterioration of isolation characteristics between the first acoustic wave filter 12A and the third acoustic wave filter 22C may be further and more effectively reduced or prevented.

Similarly, it is preferable that the contact portion 7x of the ground terminal 7B be positioned between the first signal terminal 5B and the third signal terminal 15B and between the first signal terminal 5B and the seventh signal terminal 35B. Accordingly, deterioration of isolation characteristics between the first acoustic wave filter 12A and the second acoustic wave filter 12B and isolation characteristics between the first acoustic wave filter 12A and the fourth acoustic wave filter 32D may be further and more effectively reduced or prevented.

The signal electrodes of the first acoustic wave filter 12A and the second acoustic wave filter 12B are provided on the first main surface 3a of the first piezoelectric substrate 23A. In contrast, the signal terminals of the third acoustic wave filter 22C and the fourth acoustic wave filter 32D, in addition to the signal terminals of the first acoustic wave filter 12A and the second acoustic wave filter 12B, are also provided on the second main surface 3b. Accordingly, each acoustic wave filter provided on the first piezoelectric substrate 23A and each acoustic wave filter provided on the second piezoelectric substrate 23B may be stacked in a suitable manner. Thus, the acoustic wave device 21 may be made smaller.

As described above, because the number of signal electrodes provided on the first main surface 3a is greater than the number of signal terminals provided on the second main surface 3b, the area of the ground terminal 7B tends to be small. Here, in the present preferred embodiment, the ground terminal 7B includes the contact portion 7x, which is in contact with the first piezoelectric substrate 23A. Thus, even if the area of the ground terminal 7B becomes small, propagation of each input signal to each of the other signal terminals may be effectively reduced or prevented. Therefore, the acoustic wave device 21 may be made smaller, and deterioration of isolation characteristics may be reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a first piezoelectric substrate including a first main surface and a second main surface that face each other;
   a first function electrode on the first main surface of the first piezoelectric substrate;
   a first signal electrode, a second signal electrode, and a first ground electrode on the first main surface of the first piezoelectric substrate;
   at least one insulation layer on the second main surface of the first piezoelectric substrate;
   a first signal terminal and a second signal terminal provided indirectly on the second main surface of the first piezoelectric substrate with the insulation layer interposed therebetween; and
   a ground terminal on the second main surface of the first piezoelectric substrate; wherein
   a first acoustic wave filter including the first function electrode, the first signal electrode, the second signal electrode, and the first ground electrode is provided on the first piezoelectric substrate;
   the first signal electrode and the first signal terminal are electrically coupled, the second signal electrode and the second signal terminal are electrically coupled, and the first ground electrode and the ground terminal are electrically coupled; and
   the ground terminal includes a contact portion in contact with the second main surface of the first piezoelectric substrate.

2. The acoustic wave device according to claim 1, wherein the contact portion of the ground terminal is between the first signal terminal and the second signal terminal in plan view.

3. The acoustic wave device according to claim 1, further comprising:
   a second function electrode on the first main surface of the first piezoelectric substrate;
   a third signal electrode, a fourth signal electrode, and a second ground electrode on the first main surface of the first piezoelectric substrate; and
   a third signal terminal and a fourth signal terminal provided indirectly on the second main surface of the first piezoelectric substrate with the insulation layer interposed therebetween; wherein
   a second acoustic wave filter including the second function electrode, the third signal electrode, the fourth signal electrode, and the second ground electrode is provided on the first piezoelectric substrate;
   on the first piezoelectric substrate, the third signal electrode and the third signal terminal are electrically coupled, the fourth signal electrode and the fourth signal terminal are electrically coupled, and the second ground electrode and the ground terminal are electrically coupled; and
   the contact portion of the ground terminal is between the first signal terminal and the third signal terminal in plan view.

4. The acoustic wave device according to claim 3, wherein signals are input from the first signal terminal and the third signal terminal, and signals are output from the second signal terminal and the fourth signal terminal.

5. The acoustic wave device according to claim 1, further comprising:
   a second piezoelectric substrate including a third main surface and a fourth main surface that face each other;
   a third function electrode on the third main surface of the second piezoelectric substrate;
   a fifth signal electrode, a sixth signal electrode, and a third ground electrode on the third main surface of the second piezoelectric substrate; and
   a fifth signal terminal and a sixth signal terminal provided indirectly on the second main surface of the first piezoelectric substrate with the insulation layer interposed therebetween; wherein
   a third acoustic wave filter including the third function electrode, the fifth signal electrode, the sixth signal electrode, and the third ground electrode is provided on the second piezoelectric substrate;
   the fifth signal electrode and the fifth signal terminal are electrically coupled, the sixth signal electrode and the sixth signal terminal are electrically coupled, and the third ground electrode and the ground terminal are electrically coupled; and
   the contact portion of the ground terminal is positioned between the first signal terminal and the fifth signal terminal in plan view.

6. The acoustic wave device according to claim 5, wherein signals are input from the first signal terminal and the fifth signal terminal, and signals are output from the second signal terminal and the sixth signal terminal.

7. The acoustic wave device according to claim 1, further comprising series arm resonators, a parallel arm resonator, and longitudinally-coupled resonators.

8. The acoustic wave device according to claim 7, wherein the series arm resonators are connected between the first signal electrode and the second signal electrode, and the longitudinally-coupled resonators are connected in parallel between the series arm resonators, and the parallel arm resonator is connected between the first signal electrode and a ground potential.

9. The acoustic wave device according to claim 7, wherein each of the series arm resonators and the parallel arm resonator is an acoustic wave resonator.

10. The acoustic wave device according to claim 1, wherein only a portion of the ground terminal is in contact with the second main surface of the first piezoelectric substrate.

11. The acoustic wave device according to claim 1, wherein at least a portion of the insulation layer is between the ground terminal and the second main surface of the first piezoelectric substrate.

12. The acoustic wave device according to claim 1, wherein the at least one insulation layer includes a plurality of insulation layers between the ground terminal and the second main surface of the first piezoelectric substrate.

13. The acoustic wave device according to claim 1, wherein a bump is provided on each of the first signal terminal, the second signal terminal, and the ground terminal.

14. The acoustic wave device according to claim 1, wherein the first signal terminal and the second signal terminal are only partially in contact with the first piezoelectric substrate.

15. The acoustic wave device according to claim 1, wherein the acoustic wave device is an acoustic wave filter.

16. The acoustic wave device according to claim 1, wherein the acoustic wave device is a duplexer.

17. The acoustic wave device according to claim 1, wherein the acoustic wave device is a multiplexer.

18. The acoustic wave device according to claim 1, further comprising a plurality of the first signal electrodes and a plurality of the second signal electrodes.

19. The acoustic wave device according to claim 1, wherein a number of the plurality of the first signal electrodes is greater than a number of the plurality of the second signal electrodes.

* * * * *